United States Patent [19]

Leicht et al.

[11] Patent Number: 5,045,820
[45] Date of Patent: Sep. 3, 1991

[54] THREE-DIMENSIONAL MICROWAVE CIRCUIT CARRIER AND INTEGRAL WAVEGUIDE COUPLER

[75] Inventors: John L. Leicht, Hawthorn Woods, Ill.; Hugh R. Malone, Phoenix; Douglas J. Mathews, Mesa, both of Ariz.; James E. Mitzlaff, Arlington Heights, Ill.; Scott D. Munier, Arlington Heights, Ill.; Michele G. Oehlerking, Riverside, Ill.; Vernon R. Scott, Scottsdale, Ariz.

[73] Assignee: Motorola, Inc., Schaumburg, Ill.

[21] Appl. No.: 624,946

[22] Filed: Dec. 10, 1990

Related U.S. Application Data

[63] Continuation of Ser. No. 413,348, Sep. 27, 1989, abandoned.

[51] Int. Cl.$^5$ .............................................. H01P 5/107
[52] U.S. Cl. ........................................ 333/26; 333/33; 333/238; 333/247
[58] Field of Search ................................. 333/33–35, 333/238, 246, 247, 26

[56] References Cited

U.S. PATENT DOCUMENTS

| | | | |
|---|---|---|---|
| 3,634,789 | 1/1972 | Stuckert | 333/338 X |
| 4,260,964 | 4/1981 | Saul | 333/34 X |
| 4,550,296 | 10/1985 | Ehrlinger et al. | 333/33 X |
| 4,679,249 | 7/1987 | Tanaka et al. | 333/26 X |
| 4,742,571 | 5/1988 | Letron | 333/26 X |

Primary Examiner—Paul Gensler
Attorney, Agent, or Firm—Shawn B. Dempster; F. John Motsinger

[57] ABSTRACT

A non-hermetic, three-dimensional, microwave semiconductor device carrier with integral waveguide couplers is disclosed. A molded plastic substrate having a suitable dielectric constant and varying thicknesses comprises plated conductors and locations for receiving GaAs MMIC's. MMIC's are mounted to a metal backplate and die bonded to the plated conductors. The waveguide couplers are integrally molded as part of the carrier substrate, and comprise plated through cylindrical members. Signals from a waveguide cavity are coupled to the MMIC's by inserting the waveguide couplers into a waveguide port. The carrier and integral waveguide coupler together with a plated molded cover forms a non-hermetic package providing pseudo-shielding cavities about the resident multiple semiconductor GaAs die. Transmission line impedance control is enhanced varying the substrate thickness on a per conductor basis. Frequency of operation exceeds 12 gigahertz.

40 Claims, 2 Drawing Sheets

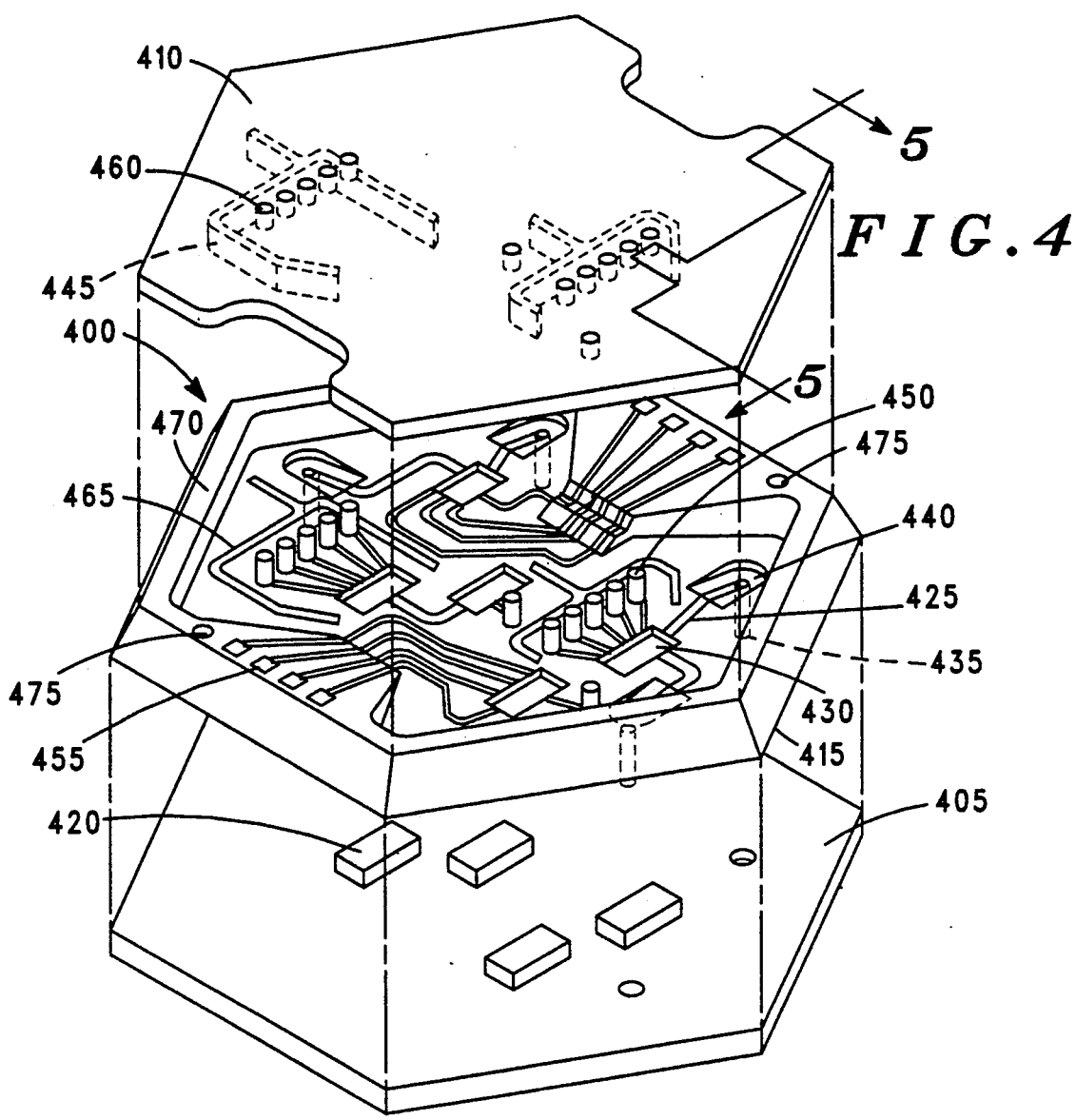
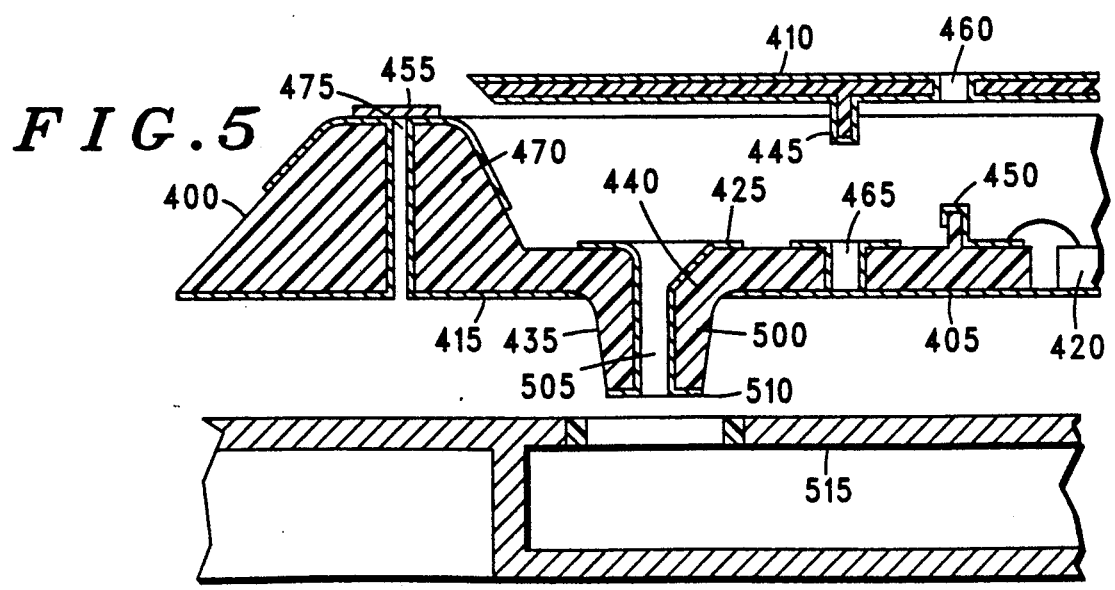

THREE-DIMENSIONAL MICROWAVE CIRCUIT CARRIER AND INTEGRAL WAVEGUIDE COUPLER

This is a continuation of application Ser. No. 07/413,348, filed Sept. 27, 1989 and now abandoned.

TECHNICAL FIELD

This invention relates generally to electrical printed circuit carriers and more specifically to circuit and device carriers (including packages) for microwave applications.

BACKGROUND OF THE INVENTION

Microwave circuit carriers come in a variety of forms, including microwave chip carriers (MCC's) and monolithic microwave integrated circuit (MMIC) packages. Typically, MCC's and MMIC packages are designed to house one semiconductor die and associated impedance matching devices such as capacitors and resistors. Subsystem carriers, however, which accept a variety of device packages, typically house multiple dies. Existing single or multiple microwave device carriers are generally hermetically sealed to conform with Military environmental standards. However, commercial demand for higher speed communication has fostered the increased use of faster switching semiconductor dies such as Gallium Arsenide (GaAs) for non-military applications. Carriers using GaAs chips are generally expensive assemblies requiring complex fabrication methods and contain numerous and various piece parts.

In addition, known carriers have difficulty in translating the performance of high frequency microwave chips to a system level due to the multiple transmission line impedance transitions required as the result of multiple materials and the type of materials incorporated in current carrier designs. To optimize signal transmission (or reception) from inside the carrier (from the MMIC die) to eventual propagation mediums such as waveguides or coaxial lines, line impedance is primarily controlled through line geometry changes and additional components (separate coaxial connectors mounted to the carrier are also used).

Traditionally, additional and separate (not integral to the carrier) probe pins or coaxial connectors (and cables) have provided the final transition between the GaAs die and the propagation medium. These microwave coupling devices add cost, increase the system complexity, and increase transmission line losses (energy radiated from transitions resulting from the use of these components). Unfortunately, no microwave semiconductor die package, known to the inventors, contains an integral propagation medium coupler, formed from the same material comprising the package, that is capable of mechanically and electrically coupling directly to a waveguide.

Moreover, as the size of microwave integrated circuits increases (integration of more circuit stages) and components are added to a substrate's surface, component density increases; therefore, varying line width becomes a limiting factor in highly dense carrier designs. Varying the thickness of the dielectric also varies the impedance of a transmission line, but existing substrates must generally undergo an additional etching or cutting process, thereby adding cost and increasing fabrication complexity.

Energy loss due to unmatched transmission lines is a critical parameter in designing high frequency microwave carriers, particularly when signal frequencies of 12 gigahertz or higher are being coupled from the die to the carrier and then to a printed circuit. Limited frequencies of operation result from the failure to minimize the number and types of transitions to effectuate proper interconnection to an external system. Known surface mount carriers aid in limiting transmission line lengths (reduce signal propagation delays) between the die and a subsequent propagation medium, but typically only house single MMIC's, have limited pinouts and have hermetic seals (expensive for many commercial or consumer applications).

Piece parts normally associated with microwave device carriers include: a separate coaxial connector to interface to an external medium, a ceramic planar dielectric substrate to host the die, hybrid circuitry and any necessary impedance matching components, a machined metal cavity housing to limit electromagnetic interference (EMI) and radio frequency interference (RFI) (it also provides structure for the hermetic seal), and a lead frame to interconnect the dies to an external printed circuit board.

Ceramic is generally used as the primary substrate material due to its dielectric properties, thermal expansion properties, and ability to host thin film (or thick film) hybrid circuitry. These properties aid in reducing transmission line losses and allow line widths to be readily varied. Ceramic's inability to be readily molded for customized designs and its high cost serve as barriers in realizing a lower cost commercial microwave device package. Not only is the ceramic substrate expensive, but the machined metal cavity and the metal coaxial connector also add weight and cost, and further restrict the size and outline of the carrier (or package) beyond acceptable limits. The problem of multiple and various types of transmission line transitions still exists with this type of package.

Hermetically sealed, ceramic flat pack surface mount packages, as understood in the art, have addressed the problems of bulk and cost associated with the machined cavity by eliminating it. Instead, energy-shielding cavities are formed by via holes, filled with conductive material such as conductive epoxy or a co-fired tungsten paste, that project through the substrate and act as conductive walls at microwave frequencies. These vias are grounded, forming a grounded cavity about the MMIC chip. Another type of shield is the seal ring which is not tied to ground and has a specified seal ring resonance. Although this package incorporates different resonant cavity designs, and is surface mountable, it still comprises a planar ceramic substrate, lead frame and other piece parts, and requires multiple and various types of transmission line transitions (including through wall transitions) to couple to a waveguide or coaxial line.

Existing subsystem carriers attempt to offer economical interconnection methods primarily between MMIC's, while providing a production-oriented design; but not between MMIC's and propagation mediums such as waveguides. One such package uses a grid array resembling a waffle. This package contains a series of dielectric coated wires running between recessed receiving locations for packaged or unpackaged chips.

This system requires layers of metal foils between wires to minimize cross-coupling and also requires manufacturing intensive wire routing to the appropriate devices. However, coupling to a waveguide must be done through an additional transition piece (probe pins). Although these subsystems may provide acceptable interconnection between multiple MMIC's, they require employ of a separate waveguide coupler and are relatively high in cost due partially to their fabrication complexity, and therefore find limited use in low cost commercial applications.

From the foregoing discussion, it is evident that existing microwave device carriers suffer in economy and performance due to the type of substrate used (primarily ceramic), the types of transitions needed, and the number of piece parts needed to form a hermetic package. Recent developments in polymer technology have resulted in plastic substrates as circuit carriers for sub-microwave frequency applications. Molded "three-dimensional" printed circuits are known only for low frequency applications. Printed circuits are considered "three-dimensional" when the substrate comprises a surface variation in at least one dimension.

These molded circuit carriers are plastic and formed by an injection molding process. Therefore, they may be shaped to avoid or adapt to physical constraints in a specific application. Patterns of conductors are metallized to predetermined surfaces of the substrate and serve as circuit traces and bonding pads for circuit components. Once components are affixed, it becomes a multi-device carrier. Plastic is generally a lossy and non-hermetic material and has not traditionally found use as substrate material in microwave carrier designs.

Since current impedance-matching techniques in gallium arsenide carriers and packages vary transmission line widths and thicknesses and add external components to control unmatched impedances, providing an inexpensive variable thickness substrate would provide an additional impedance-controlling mechanism not traditionally found in microwave frequency applications. Readily varying the thickness of the substrate on a per-conductor basis allows the carrier designer greater flexibility when designing dense MMIC carriers.

Accordingly, there exists a need for a surface mount, high frequency microwave circuit carrier and integral waveguide coupler, having a three-dimensional shape wherein its shape may be molded to accommodate specific applications. It should reduce traditional piece part counts to effectuate a reduction in cost and energy losses and provide an insulating member capable of additional impedance varying capabilities on a per conductor basis. It should also be capable of accepting more than one microwave device. In addition, interconnections between multiple devices should be achieved by low-cost manufacturing techniques.

BRIEF SUMMARY OF THE INVENTION

These needs and others are substantially met through the surface mount three-dimensional microwave circuit carrier and integral waveguide coupler disclosed below. This invention is a surface mount, microwave circuit carrier and integral waveguide coupler, having a molded plastic dielectric substrate with a circuit plated thereon to couple with a microwave device, and also contains an integral waveguide transition molded as part of the substrate. This waveguide transition comprises a plated through hole and injects microwave energy into a waveguide and also receives energy from the waveguide.

The substrate is a plastic three-dimensional microwave printed circuit, having an insulating member (plastic) with at least one adaptable impedance characteristic such as variable thickness or variable density where the impedance characteristic is varied on a per conductor basis. It is further comprised of means for providing ground return for microwave energy coupled by the conductor. Locations for receiving multiple MMIC chips and interconnections between them are provided. A backplate provides heat sinking for the MMIC chips and the substrate, and a plated molded cover forms shielding cavities around the MMIC chips. Other low power devices may be surface mounted directly to the substrate.

BRIEF DESCRIPTION OF THE DRAWINGS

FIG. 4 generally depicts an exploded view of a surface mount microwave device carrier and integral waveguide coupler with cover in accordance with the invention.

FIG. 5 generally depicts an exploded cross-sectional view of a surface mount integral microwave package and waveguide coupler interfacing with a waveguide structure in accordance with the invention.

DETAILED DESCRIPTION OF THE PREFERRED EMBODIMENT

Figure 1:
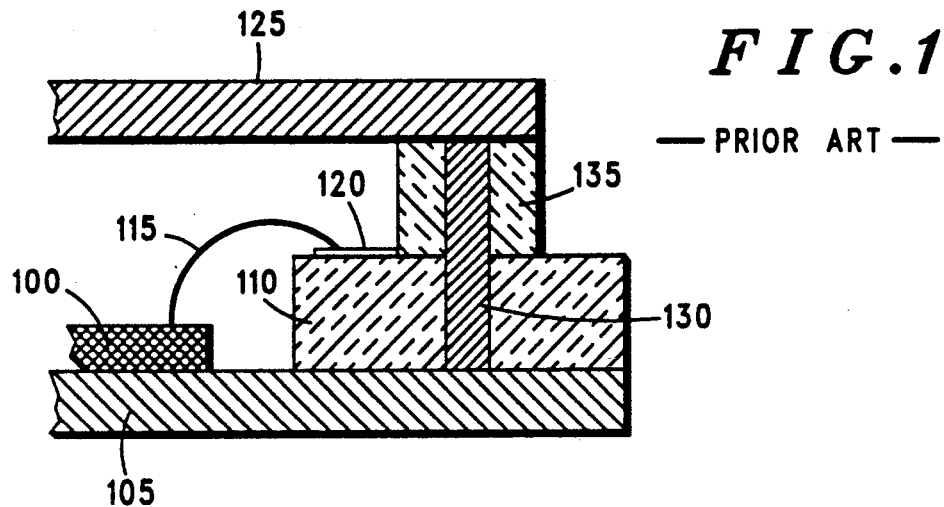
FIG. 1 depicts a partial cross-sectional view of a prior art hermetic single chip MMIC package.

FIG. 1 generally depicts a typical hermetic GaAs single chip MMIC package. It comprises a MMIC chip (100) attached to the metal base (105) of the package. A transition, from the MMIC chip (100) to a first ceramic layer (110), is made by the wire bond (115) and a thin film conductor (120) disposed on the first ceramic layer (110). A transmission line is then formed between the thin film conductor (120) inside the package and the metal base (105).

In general, a transmission line must pass through the seal wall of a hermetic package to get outside the package. The metal cover (125) is electrically connected to the metal base (105) using electrically conductive filled vias (130) and serves to form a pseudo-continuous metal cavity around the MMIC (100), providing both shielding from external electromagnetic interference (EMI) and radio frequency interference (RFI), while further reducing energy radiated from the MMIC to an external device outside the package. This cavity determines the package's resonant frequency. The metal cover (125) is supported by a second ceramic layer (135), and forms a stripline with the metal base (105) and the thin film conductor (120) at the seal wall of the hermetic package.

The transition from a microstrip inside the package to the stripline at the seal wall requires conductor width modification to compensate for the impedance variation from this transition. This method results in larger surface area packages to accommodate varying the signal path widths. Further transitions are needed to couple this package to a waveguide.

Figure 2:
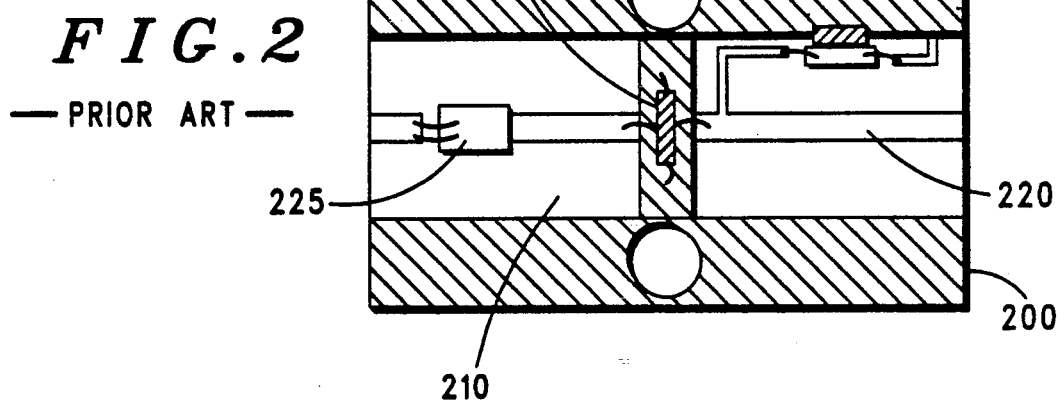
FIG. 2 generally depicts a cross-sectional view of a typical chip carrier.

FIG. 2 shows generally the top view of a typical chip carrier where the chip is not packaged in a separate hermetic package before being mounted to a substrate. A machined metal baseplate (200), comprised of through holes (205) for mounting to the next level assembly, hosts one or more ceramic (alumina) substrates (210) and one or more MMIC chips (215). The MMIC chip (215) may be attached to the metal baseplate (200) using an electrically and thermally conductive epoxy. Hybrid circuitry, comprised of thin film conductors (220) and chip components, such as capacitors (225), is disposed on the substrates (210). Separate (non-integral) metal coaxial connectors are often mounted to the machined baseplate (200) and facilitate interconnection between the MMIC (215) and an external propagation medium. This carrier may then mount to another assembly and electrically interconnect to other assemblies.

Figure 3:
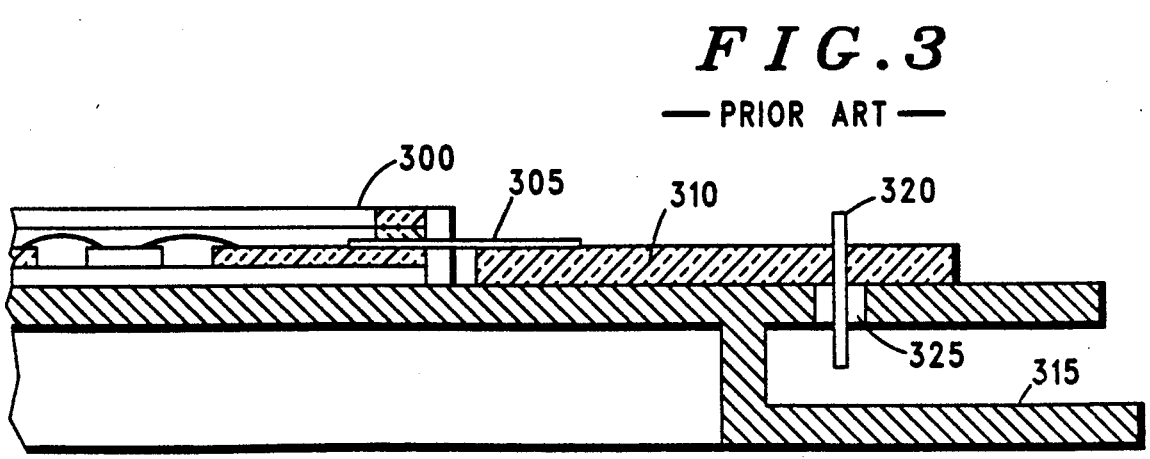
FIG. 3 generally depicts a cross-sectional view of typical transition interconnects between a MMIC package and multiple waveguide using a Teflon-glass substrate with a microstrip line, and pin probes.

FIG. 3 depicts the numerous transitions, components, and materials typically needed to interconnect a MMIC chip to multiple waveguides. A MMIC package (300) with coplanar contacts (305), is connected to a Teflon-glass substrate (310) comprised of microstrip lines. Both the MMIC package (300) and the substrates (310) are attached to the waveguide casting (315). A microwave waveguide probe pin (320) is inserted through the substrate (310) and into the waveguide (315), then transitioned to the microstrips on the substrate (310). Probe pins, as known in the art, are typically solid, and couple microwave energy between a waveguide and another medium, such as a printed circuit board.

A dielectric (other than air) (325) is typically inserted into the hole of the waveguide that receives the probe, forming a coaxial transition. Impedance of the probe (320) and the dielectric (325) transition must be matched to the microstrip on the substrate. Typically, the width of the line is varied to achieve a substantially-matched transition. Again, when multiple MMIC's are used with multiple waveguides, the surface area of the substrate becomes scarce, resulting in larger, more expensive, ceramic substrate outlines.

The invention, as set forth in the exploded view of FIG. 4, is comprised of a plated, injection-molded, three-dimensional circuit carrier and integral waveguide coupler (400), a metal backplate (405), and a plated injection molded cover (410). A final assembly of these components forms a customized, low-cost, high-frequency microwave, non-hermetic GaAs MMIC package for commercial use.

The carrier and integral waveguide coupler (400) is injection-molded into a three-dimensional shape from a polyetherimide plastic, such as "Ultem" available from General Electric, and has conductors metallized in predetermined locations using a suitable plating process that provides a substantially smooth conductor surface (to minimize transmission line losses). This plastic is a low-loss type having a suitable dielectric constant for high frequency microwave applications. Unlike traditional MMIC carriers and packages, the plated plastic substrate (400) is a device carrier and integral (unitary member) waveguide transition, and an impedance-matching medium. The non-hermeticity feature results from the properties of plastic, as understood in the art.

Generally, as depicted in FIG. 4, the three-dimensional carrier (400) is comprised of plated circuit traces (425) on the top surface and receiving holes (430) for a multiple number of MMIC chips. The underside surface (415) of the carrier (400) is entirely plated, providing a ground plane in addition to EMI and RF shielding. The combination of the traces (425) and the ground plane (415) form transmission lines for microwave energy.

Plated through holes (475) (also see FIG. 5) bring the ground plane to the top side of the carrier, thereby modifying its shape, enlarging its surface area, and providing easier access for top side interconnect. Other methods of providing grounding for the MMIC chips (420) may be employed where appropriate. An embodiment of the invention providing locations for mounting low-power devices directly to a surface of the plated substrate (using such methods as conductive adhesive epoxy or any other suitable attachment and interconnect methods) further exploits the invention's design as a circuit and device carrier.

The waveguide couplers (435) are molded as an integral part of the substrate (400) and are plated through conical-shaped members. MMIC chips (420) are attached to the metal backplate (405) via an electrically and thermally conductive adhesive disposed on the top surface of the backplate (405). The MMIC chips (420) are electrically wire-bonded directly to the circuit traces (425) associated with a particular MMIC. Surface mount electrical interconnections from the MMIC chips (420) (or any other on-carrier components) to an off-carrier object, are facilitated by the integral molded plated posts (nubs) (450) and circuit pads (455) located throughout the carrier. The plated posts (450) extend through holes (460) in the cover, thereby providing electrical contact surfaces on the top of the cover. Other types of surface mount and and non-surface mount interconnections, such as direct wire bonds, may provide versatile carrier interconnect combinations.

An integral molded rim (470) provides support for the cover (410) and protection against mechanical damage during handling. An alternative embodiment of the invention may include molding the rim as part of the cover or eliminating portions or all of it where appropriate.

The plastic three-dimensional feature of the carrier (400) provides an additional impedance-matching variable not traditionally associated with GaAs MMIC carriers (or packages). Although line width variation may be used, varying the thickness (440) of the substrate provides the designer with a method for controlling transition impedances while conserving substrate surface area. This improves the circuit density on the carrier. The substrate comprises the variable thickness impedance-matching characteristic that may be varied on a per conductor basis. Moreover, variable thickness need not be constant or restricted to linear variations (planar). Other characteristics may include non-dimensional variations to the molded substrate material such as dielectric constant variations or material density variations.

Furthermore, the carrier (400) may be custom-molded to suit specific applications ranging from a simple circuit trace carrier to a multiple MMIC chip carrier and subsystem carrier. An alternative embodiment may include multiple layers of conductors disposed throughout the substrate similar in concept to multilayer printed circuit boards.

The plated molded cover (410) may be a second molded substrate for surface mount devices. It comprises walls (445) and holes (460) for receiving the posts (450). Applying the cover (410) to the carrier (400), forming DC contact, causes the plated molded walls (445) on the cover and the molded rim (470) of the carrier surface to form pseudo-shielding cavities around the MMIC chips (420), reducing radiated energy emissions and limiting EMI and RFI. The walls (445) extend through the slots (465) in the carrier (400) and attach, making electrical contact via conductive adhesive (or any other suitable coupling method), to the backplate (405).

An alternative embodiment may include the use of plated through holes in either the carrier or cover, similar in effect to filled vias known in the art, to form pseudo walls around the MMIC chips (420) in combination with the cover (410). Another embodiment may comprise non-plated holes in the cover for receiving the posts, and, in addition, a series of plated through holes in the cover to reduce microwave cavity sizes formed by the plated cover and the plastic between its plated surfaces.

The backplate (405) serves as a heat sink and ground plane for the MMIC chips (420). Metal alloys or other suitable materials capable of acting either as a heat sink or a ground plane, or both may be used. It further comprises thermal expansion properties appropriate for die mounting the GaAs chips (420). Electrically conductive adhesive thermally and electrically connects the backplate to the plated underside (415), decreasing ground plane resistance to enhance electrical performance. A plated underside may not be necessary if sufficient shielding and grounding is provided by other suitable means.

In FIG. 5, the molded circuit carrier (400) and waveguide coupler cross section illustrates how the coupler eliminates the need for a pin probe. The integral coupler is comprised as part of the carrier and further comprises a molded conical member (500) with a plated through hole (505). A coaxial transition to the waveguide (515) is formed with the the plated through hole (505) as the inner conductor, the dielectric plastic member (500), air, and a dielectric in the waveguide port forming the inner dielectric, and the waveguide (515) as the outer conductor. A coupler's dimensions are related to characteristics associated with the waveguide and are determined by methods well-understood in the art.

The outer shape of the coupler (500) may be formed to any shape desirable to effectuate their purpose. The shape of the plated through hole may be rectangular, cylindrical, iris, or any shape appropriate for the intended application. Plating is extended to the outer edges of the base of the coupler (510), forming an integral loading disk capacitor providing broader band performance, as well-understood in the art. Impedance matching between the coaxial waveguide coupler (435) and a microstrip transmission line (425) is accomplished by the variable thickness area (440) aforementioned. Other forms of propagation medium couplers may be fabricated from the plated plastic substrate such as coaxial interconnects having plated threads or waveguide couplers of rectangular, iris, or any other suitable geometries.

Although one embodiment of the invention discloses molded polyetherimide plastic as the substrate material, this specification teaches one with average skill in the art that any suitable substrate material (or suitable combinations of substrate materials), such as ceramic or other thermoplastic polymers, whether molded or not, may be used to effectuate the aforementioned invention. Further, although the disclosed invention is designed to operate in a frequency range of 12-26 gigahertz, as is obvious to one with average skill in the art, the above-described invention or devices claimed below may operate at frequencies above or below this range.

What is claimed is:

1. A microwave circuit carrier, comprising:
   (a) substrate means located in a first plane for receiving at least one electronic device which processes microwave signals; and
   (b) waveguide coupler means integrally molded with the substrate means for coupling microwave signals between the at least one electronic device and a waveguide, the waveguide having a wall located in a second plane adjacent and substantially parallel to the first plane wherein one of the first and second planes is substantially disposed above the other plane.

2. The microwave circuit carrier of claim 1 wherein the waveguide coupler means comprises:
   (a) a projecting means for projecting into the waveguide; and
   (b) a conductor, disposed on a surface of the substrate means, coupled to the projecting means.

3. The microwave circuit carrier of claim 2 wherein the projecting means comprises a plated through hole whereby microwave energy can be coupled between the at least one electronic device and the waveguide.

4. The microwave circuit carrier of claim 1 wherein the substrate means comprises dielectric composite material.

5. The microwave circuit carrier of claim 4 wherein the dielectric composite material comprises at least one of the following materials: ceramics and polymers.

6. The microwave circuit carrier of claim 1 wherein the waveguide coupler means comprises impedance matching means for varying the impedance characteristic between the at least one electronic device and the waveguide.

7. The microwave circuit carrier of claim 6 wherein the waveguide coupler means comprises a dielectric composite material.

8. The microwave circuit carrier of claim 7 wherein the dielectric composite material comprises at least one of the following materials: ceramics and polymers.

9. The microwave circuit carrier of claim 7 wherein the varied impedance characteristic is the thickness of the dielectric composite material.

10. The microwave circuit carrier of claim 2 wherein the substrate comprises another surface with a conductor disposed thereon arranged such that the two surface conductors are on substantially opposite surfaces of the substrate means thereby forming a transmission line.

11. A microwave circuit carrier, comprising:
   (a) a backplate located in a first plane, the first plane further comprising a wall of a waveguide;
   (b) a first substrate coupled to the backplate, the first substrate being located in a second plane adjacent and substantially parallel to the first plane wherein one of the first and second planes is substantially disposed above the other plane, comprising
      (i) means for receiving at least one electronic device which processes microwave signals; and
      (ii) waveguide coupler means integrally molded with the means for receiving for coupling microwave signals between the at least one electronic device and the waveguide; and
   (c) a second substrate coupled to the first substrate such that a cavity is provided about the means for receiving.

12. The microwave circuit carrier of claim 11 wherein the waveguide coupler means comprises:
   (a) a projecting means for projecting into the waveguide; and (b) a conductor, disposed on a surface of the first substrate, coupled to the projecting means.

13. The microwave circuit carrier of claim 12 wherein the projecting means comprises a plated through hole whereby microwave energy can be coupled between the at least one electronic device and the waveguide.

14. The microwave circuit carrier of claim 11 wherein the first and second substrate comprise dielectric composite material.

15. The microwave circuit carrier of claim 14 wherein the dielectric composite material comprises at least one of the following materials: ceramics and polymers.

16. The microwave circuit carrier of claim 11 wherein the waveguide coupler means comprises impedance matching means for varying the impedance characteristic between the at least one electronic device and the waveguide.

17. The microwave circuit carrier of claim 16 wherein the waveguide coupler means comprises a dielectric composite material.

18. The microwave circuit carrier of claim 17 wherein the dielectric composite material comprises at least one of the following materials: ceramics and polymers.

19. The microwave circuit carrier of claim 17 wherein the varied impedance characteristic is the thickness of the dielectric composite material.

20. The microwave circuit carrier of claim 12 wherein the first substrate comprises another surface with a conductor disposed thereon arranged such that the two surface conductors are on substantially opposite surfaces of the first substrate thereby forming a transmission line.

21. The microwave circuit carrier of claim 11 wherein:
    (a) the first substrate comprises a surface with a conductor disposed thereon; and
    (b) the second substrate comprises a surface with a conductor disposed thereon whereby a substantial electromagnetic energy shielding cavity is provided about the means for receiving.

22. The microwave circuit module of claim 11 wherein the backplate is electrically conductive.

23. A microwave circuit module, comprising:
    (a) a backplate located in a first plane, the first plane further comprising a wall of a waveguide;
    (b) a first substrate coupled to the backplate, the first substrate being located in a second plane adjacent and substantially parallel to the first plane wherein one of the first and second planes is substantially disposed above the other plane, comprising
        (i) means for receiving at least one electronic device which processes microwave signals; and
        (ii) waveguide coupler means integrally molded with the means for receiving for coupling the microwave signals between the at least one electronic device and the waveguide;
    (c) at least one electronic device coupled to the means for receiving; and
    (d) a second substrate coupled to the first substrate such that a cavity is provided about the means for receiving.

24. The microwave circuit module of claim 23 wherein the waveguide coupler means comprises:
    (a) a projecting means for projecting into the waveguide; and
    (b) a conductor, disposed on a surface of the first substrate, coupled to the projecting means.

25. The microwave circuit module of claim 24 wherein the projecting means comprises a plated through hole whereby microwave energy can be coupled between the at least one electronic device and the waveguide.

26. The microwave circuit module of claim 23 wherein the first and second substrate comprise dielectric composite material.

27. The microwave circuit module of claim 26 wherein the dielectric composite material comprises at least one of the following materials: ceramics and polymers.

28. The microwave circuit module of claim 23 wherein the waveguide coupler means comprises impedance matching means for varying the impedance characteristic between the at least one electronic device and the waveguide.

29. The microwave circuit module of claim 28 wherein the waveguide coupler means comprises a dielectric composite material.

30. The microwave circuit module of claim 29 wherein the dielectric composite material comprises at least one of the following materials: ceramics and polymers.

31. The microwave circuit module of claim 29 wherein the varied impedance characteristic is the thickness of the dielectric composite material.

32. The microwave circuit module of claim 24 wherein the first substrate comprises another surface with a conductor disposed thereon arranged such that the two surface conductors are on substantially opposite surfaces of the first substrate thereby forming a transmission line.

33. The microwave circuit module of claim 23 wherein:
    (a) the first substrate comprises a surface with a conductor disposed thereon; and
    (b) the second substrate comprises a surface with a conductor disposed thereon whereby a substantial electromagnetic energy shielding cavity is provided about the means for receiving.

34. The microwave circuit module of claim 23 wherein the backplate is electrically conductive.

35. The microwave circuit module of claim 34 wherein the first substrate is coupled to the backplate by an attachment member which is electrically conductive.

36. The microwave circuit module of claim 23 wherein the backplate is thermally conductive.

37. The microwave circuit module of claim 36 wherein the first substrate is coupled to the backplate by an attachment member which is thermally conductive.

38. The microwave circuit module of claim 23 wherein the at least one electronic device is a semiconductor die.

39. The microwave circuit module of claim 38 wherein the semiconductor die is comprised of gallium arsenide.

40. The microwave circuit module of claim 38 wherein the semiconductor die operates at a frequency of at least 12 gigahertz.

* * * * *